United States Patent
Gaskins et al.

(10) Patent No.: US 8,683,253 B2
(45) Date of Patent: Mar. 25, 2014

(54) OPTIMIZED SYNCHRONOUS STROBE TRANSMISSION MECHANISM

(75) Inventors: Darius D. Gaskins, Austin, TX (US); James R. Lundberg, Austin, TX (US)

(73) Assignee: VIA Technologies, Inc., New Taipei (TW)

(*) Notice: Subject to any disclaimer, the term of this patent is extended or adjusted under 35 U.S.C. 154(b) by 406 days.

(21) Appl. No.: 13/165,654

(22) Filed: Jun. 21, 2011

(65) Prior Publication Data

US 2012/0331327 A1   Dec. 27, 2012

(51) Int. Cl.
*G06F 1/12* (2006.01)

(52) U.S. Cl.
USPC ........... 713/401; 713/500; 713/503; 714/700; 327/153; 365/193

(58) Field of Classification Search
USPC ........... 713/401, 500, 503; 714/700; 327/153; 365/193
See application file for complete search history.

(56) References Cited

U.S. PATENT DOCUMENTS

| | | | | |
|---|---|---|---|---|
| 4,415,984 A * | 11/1983 | Gryger et al. | | 713/401 |
| 5,371,880 A | 12/1994 | Bhattacharya | | |
| 6,202,168 B1 | 3/2001 | Saito et al. | | |
| 6,397,312 B1 * | 5/2002 | Nakano et al. | | 711/167 |
| 6,707,723 B2 * | 3/2004 | Jeong | | 365/189.05 |
| 6,813,724 B2 | 11/2004 | Saito | | |
| 6,892,314 B2 | 5/2005 | Chen | | |
| 7,171,321 B2 | 1/2007 | Best | | |
| 7,272,055 B2 * | 9/2007 | Kishimoto et al. | | 365/194 |
| 7,280,417 B2 | 10/2007 | Choi et al. | | |
| 7,283,380 B1 | 10/2007 | Srinivasan et al. | | |
| 7,376,043 B2 * | 5/2008 | Murayama | | 365/233.1 |
| 7,406,646 B2 * | 7/2008 | Sato et al. | | 714/744 |
| 7,543,090 B2 | 6/2009 | Lundberg | | |
| 7,701,267 B2 * | 4/2010 | Yoon et al. | | 327/147 |
| 7,733,711 B2 | 6/2010 | Burnett et al. | | |
| 7,936,621 B2 * | 5/2011 | Okuda et al. | | 365/194 |
| 2003/0217303 A1 | 11/2003 | Chua-Eoan et al. | | |
| 2004/0113654 A1 | 6/2004 | Lundberg | | |
| 2007/0217559 A1 | 9/2007 | Stott et al. | | |
| 2008/0013663 A1 | 1/2008 | Cornelius et al. | | |

* cited by examiner

*Primary Examiner* — Thuan Du
(74) *Attorney, Agent, or Firm* — Richard K. Huffman; James W. Huffman

(57) ABSTRACT

An apparatus that compensates for misalignment on a synchronous data bus, including a resistor network, a transmitting device, and a receiving device. The resistor network indicates an amount to advance a synchronous data strobe associated with a data group. The transmitting device has a core clocks generator and a synchronous strobe driver. The core clocks generator advances a data strobe clock by the amount. The synchronous strobe driver employs the data strobe clock to generate the synchronous data strobe, where the synchronous data strobe is advanced also by the amount. The receiving device has a composite delay element and delay-locked loops (DLLs). The composite delay element equalizes delay paths within the receiving device, where the delay paths correspond to the synchronous data strobe that is received from the transmitting device.

21 Claims, 5 Drawing Sheets

APPARATUS FOR ADVANCED SYNCHRONOUS STROBE TRANSMISSION

PRESENT DAY SOURCE SYNCHRONOUS DATA TRANSMISSION

PRESENT DAY SOURCE SYNCHRONOUS TRANSMISSION/RECEPTION

*APPARATUS FOR DELAYED SYNCHRONOUS DATA RECEPTION*

*DELAY-LOCKED LOOP*

OPTIMIZED SYNCHRONOUS STROBE TRANSMISSION MECHANISM

CROSS-REFERENCE TO RELATED APPLICATIONS

This application is related to the following co-pending U.S. Patent Applications, each of which has a common assignee and common inventors.

| SERIAL NUMBER | FILING DATE | TITLE |
| --- | --- | --- |
| 13/165,650 | Jun. 21, 2011 | APPARATUS AND METHOD FOR ADVANCED SYNCHRONOUS STROBE TRANSMISSION |
| 13/165,659 | Jun. 21, 2011 | APPARATUS AND METHOD FOR DELAYED SYNCHRONOUS DATA RECEPTION |
| 13/165,664 | Jun. 21, 2011 | OPTIMIZED SYNCHRONOUS DATA RECEPTION MECHANISM |
| 13/165,665 | Jun. 21, 2011 | PROGRAMMABLE MECHANISM FOR SYNCHRONOUS STROBE ADVANCE |
| 13/165,661 | Jun. 21, 2011 | PROGRAMMABLE MECHANISM FOR DELAYED SYNCHRONOUS DATA RECEPTION |
| 13/165,679 | Jun. 21, 2011 | PROGRAMMABLE MECHANISM FOR OPTIMIZING A SYNCHRONOUS DATA BUS |

BACKGROUND OF THE INVENTION

1. Field of the Invention

This invention relates in general to the field of microelectronics, and more particularly to an apparatus and method for synchronizing and clocks and data related to the transmission and reception of source synchronous signals.

2. Description of the Related Art

A present day computer system employs a source synchronous system bus to provide for exchange of data between bus agents, such as between a microprocessor and a memory hub. A "source synchronous" bus protocol allows for the transfer of data at very high bus speeds. Source synchronous protocols operate on the principle that a transmitting bus agent places data out on the bus for a fixed time period and asserts or switches a "strobe" signal corresponding to the data to indicate to a receiving bus agent that the data is valid. Both data signals and their corresponding strobe are routed over the bus along equal propagation paths, thus enabling a receiver to be relatively certain that when switching of the corresponding strobe is detected, data is valid on the data signals.

But data strobes and data signals are subject to error for a number of reasons. One source of error is inaccuracies of associated clock generation circuits, typically phase locked loops, that are employed to gate the data signals onto the bus and to switch the strobes to indicate that the data is valid. These inaccuracies may be the result of design margins, fabrication tolerances, or environmental factors. In an optimum case, it is desired that a strobe signal switch precisely halfway through a data validity period so that there is equal set up and hold time for the data as seen at the receiver. And inaccuracies in the associated clock generation circuits may result in skewing of the data signals and/or their strobes such that reception conditions are not optimum.

Another source of error caused by distribution of a strobe signal within a receiving device. While system designers go to great lengths to ensure that a strobe and its associated data signals are routed along the same propagation path on a system board (i.e., motherboard), it is well known that once the strobe enters the receiving device, it must be distributed to all of the internal synchronous receivers that are associated with that strobe. In some devices, the additional propagation lengths that are required to route the strobe to various receivers may add delay over that of the data signals, thereby skewing the phase of the synchronous transmission.

Therefore, what is needed are apparatus and methods that compensate for misalignment of signals on a synchronous data bus.

What is also needed is a technique that allows the signals on a synchronous bus to be optimized for reception by modifying the phase alignment of a data strobe and its corresponding data signals.

What is furthermore needed is a mechanism that allows the phase alignment of a data strobe and its associated data signals to be modified at the motherboard level.

What is moreover needed is an apparatus that is programmable at the motherboard level to align synchronous bus signals for optimum reception conditions.

SUMMARY OF THE INVENTION

The present invention, among other applications, is directed to solving the above-noted problems and addresses other problems, disadvantages, and limitations of the prior art. In addition, the present invention provides a superior technique for optimizing the transmission and reception of source synchronous signals in disparate devices such as microprocessors and their support devices. In one embodiment, an apparatus is provided that compensates for misalignment on a synchronous data bus. The apparatus includes a resistor network, a transmitting device, and a receiving device. The resistor network is configured to provide a ratio signal that indicates an amount to advance a synchronous data strobe associated with a data group. The transmitting device has a core clocks generator and a synchronous strobe driver. The core clocks generator is coupled to the ratio signal, and is configured to advance a data strobe clock by the amount. The synchronous strobe driver is configured to receive the data strobe clock, and is configured to employ the data strobe clock to generate the synchronous data strobe, where the synchronous data strobe, when enabled, is advanced also by the amount. The receiving device has a composite delay element. The composite delay element is configured to equalize delay paths within the receiving device, where the delay paths correspond to the synchronous data strobe that is received from the transmitting device.

One aspect of the present invention contemplates an apparatus that compensates for misalignment on a synchronous data bus. The apparatus includes a resistor network, a microprocessor, and a receiving device. The resistor network is configured to provide a ratio signal that indicates an amount to advance a synchronous data strobe associated with a data group. The microprocessor has a core clocks generator and a synchronous strobe driver. The core clocks generator is coupled to the ratio signal, and is configured to advance a data strobe clock by the amount. The synchronous strobe driver is configured to receive the data strobe clock, and is configured to employ the data strobe clock to generate the synchronous data strobe, where the synchronous data strobe, when enabled, is advanced also by the amount. The receiving device has a composite delay element. The composite delay element is configured to equalize delay paths within the receiving device, where the delay paths correspond to the synchronous data strobe that is received from the transmitting device.

Another aspect of the present invention comprehends a method for compensating for misalignment on a synchronous data bus. The method includes employing a resistor network to provide a ratio signal that indicates an amount to advance a synchronous data strobe associated with a data group; within a transmitting device, coupling a core clocks generator to the ratio signal, configuring the core clocks generator to advance a data strobe clock by the amount; providing the data strobe clock signal to a synchronous strobe driver within the transmitting device, and using the data strobe clock to generate the synchronous data strobe, where the synchronous data strobe, when enabled, is advanced also by the amount; and via a composite delay element within a receiving device, equalizing delay paths within the receiving device, where the delay paths correspond to the synchronous data strobe that is received from the transmitting device.

Regarding industrial applicability, the present invention is implemented within a MICROPROCESSOR which may be used in a general purpose or special purpose computing device.

BRIEF DESCRIPTION OF THE DRAWINGS

These and other objects, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

In view of the above background discussion on source synchronous signaling and associated techniques employed within present day devices for the transmission and reception of data, a discussion of the disadvantages and limitations of the present day techniques be discussed with reference to FIGS. 1-2. Following this, a discussion of the present invention will be presented with reference to FIGS. 3-7. The present invention overcomes these limitations and disadvantages by providing mechanisms that allow for the delay and advance of both data strobes and associated data bits in coupled devices thereby providing a technique to correct for strobe and data misalignment caused by any of a number of reasons, thus enabling throughput to be optimized between the coupled devices.

Figure 1:
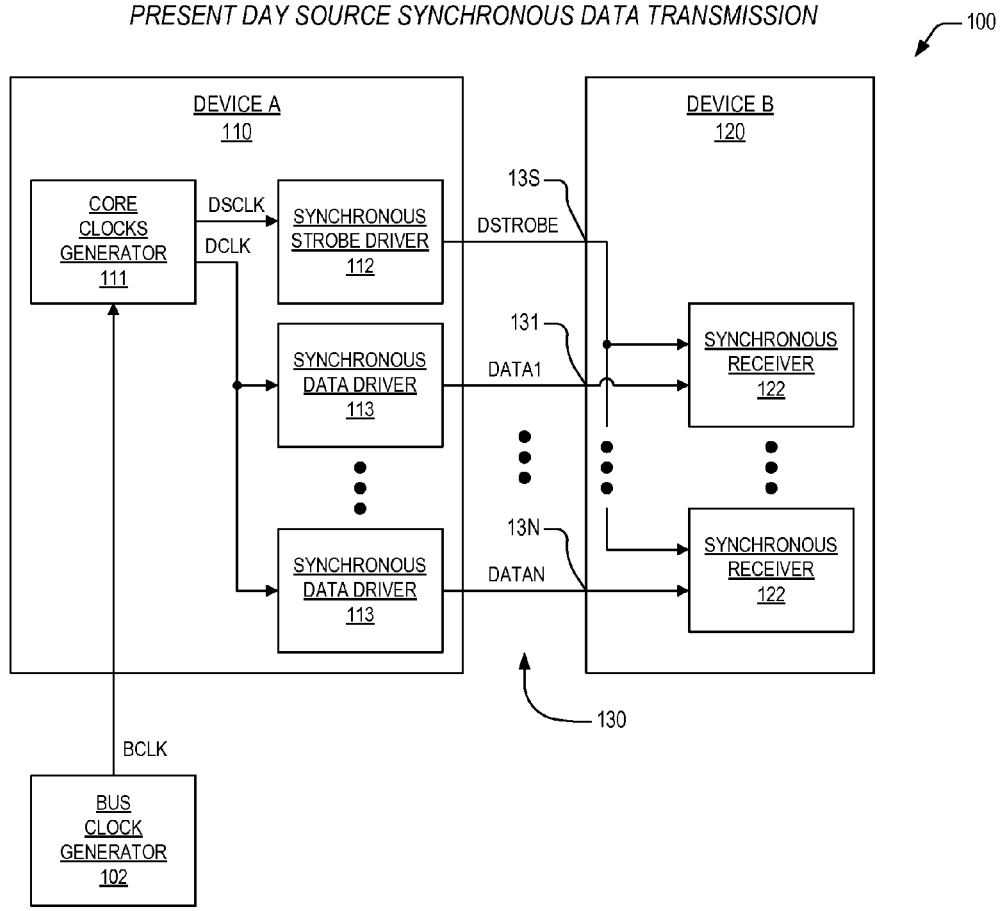
FIG. 1 is a block diagram illustrating a present day system wherein source synchronous data is transmitted and received.

Turning to FIG. 1, is a block diagram is presented illustrating a present day system 100 wherein source synchronous data is transmitted and received. The system 100 includes a transmitting device 110 (DEVICE A) that is coupled to a receiving device 120 (DEVICE B) via a source synchronous bus 130 comprising a data strobe DSTROBE and a plurality of data bits DATA1-DATAN associated therewith. The system 100 also includes a bus clock generator 102 that is coupled to DEVICE A 110 via a bus clock signal BCLK. The devices 110, 120 and the bus clock generator 102 are typically disposed on a conventional motherboard (not shown) or substantially similar interconnection mechanism where DATA1-DATAN, DSTROBE, and BCLK are embodied as traces interconnecting the two devices 110, 120. DSTROBE enters DEVICE B 120 at point 13S, and the data bits DATA1-DATAN enter DEVICE B 120 at points 132-13N. In a typical source synchronous configuration, the physical lengths of the traces for a group of data bits DATA1-DATAN and their associated data strobe DSTROBE are designed to be equivalent so that any the transmission line effects such as propagation delay that are experienced by DSTROBE are also experienced by DATA1-DATAN, and it is a goal of the source synchronous data system 100 for DSTROBE to switch states precisely halfway during the period that DATA1-DATAN are valid on the bus 130, thus providing the most favorable conditions for proper reception of transmitted data in DEVICE B 120.

DEVICE A 110 has a core clocks generator 111 that generates, among other clock signals (not shown), a data strobe clock signal DSCLK, which is coupled to a synchronous strobe driver 112, and a data clock signal DCLK, which is coupled to a plurality of synchronous data drivers 113. The synchronous strobe driver 112 generates DSTROBE in phase with DSCLK and the synchronous data drivers 113 generate data bits DATA1-DATAN in phase with DCLK. These clocks DSCLK, DCLK are derived from BCLK, thus allowing for overall synchronization of data transmission and reception with other devices (not shown) in the system 100. In a typical embodiment, DCLK and DSCLK are frequency multiples of BCLK to allow for precise alignment of DSTROBE within the period of validity of the data bits DATA1-DATAN on the bus 130. Other configurations may employ a single derived clock signal for both strobe types and trigger data transmission on one edge of the derived clock signal and trigger a strobe on the other edge of the derived clock signal.

DEVICE B 120 has a corresponding plurality of synchronous receivers 122, each receiving one of the data bits DATA1-DATAN and all receiving the data strobe DSTROBE. The synchronous receivers 122 each sample their respective one of the data bits DATA1-DATAN when DSTROBE is clocked (i.e., when DSTROBE changes state).

As one skilled in the art will appreciate, the system 100 of FIG. 1 represents a simplified configuration of devices 110, 120 that typifies what may be found in any present day desktop or laptop computer, tablet computer, or any of a number of special purpose computing devices and instruments. More specifically, the devices 110, 120 may be embodied as a central processing unit (CPU) or microprocessor, a supporting chipset or memory interface, a memory hub or controller, a direct memory access unit, a graphics controller, and the like. Conventionally, these devices 110, 120 are known as bus agents, and they are coupled to one another via a point-to-point source synchronous bus 130, as is exemplified by the bus 130 of FIG. 1.

In broad terms, to transfer data, one of the bus agents 110 will drive a subset of the signals DATA1-DATAN, DSTROBE on the bus 130 while another of the bus agents 120 detects and receives the driven signals, thus capturing the data that is represented by the states of one or more of the subset of the signals DATA1-DATAN, DSTROBE on the bus 130. There are a number of different bus protocols represented in the present day art for transferring data between two bus agents, and it is beyond the scope of this application to provide a detailed description of these various techniques. It is sufficient herein to appreciate that the "data" which is communicated between two or more bus agents 110, 120 during a bus transaction may include, but is not limited to, address information, data that is associated with one or more addresses, control information, or status information. Regardless of the type of data that is communicated over the bus 130, it is noteworthy for this application that most present day systems 100 are employing a particular type of bus protocol commonly known as "source synchronous" protocol, to effect the transfer of data at very high bus speeds. In contrast to prior art bus protocols, source synchronous protocols operate on the principle that a transmitting bus agent 110 places data signals DATA1-DATAN within a data group out on the bus 130 for a fixed time period and asserts the data strobe signal DSTROBE corresponding to the data bit signals DATA1-DATAN to indicate to a receiving bus agent 120 that the data is valid. As is noted above, it is a goal of these systems 100 that the strobe DSTROBE indicate validity of the data bits DATA1-DATAN at a time (typically halfway during the period when the data DATA1-DATAN is valid) that is optimum for reception of the data bits DATA1-DATAN by the receiving device 120.

One skilled in the art will appreciate that the propagation path, including physical and electrical parameters, of one set of data bits DATA1-DATAN and corresponding strobe signal DSTROBE, at very high transfer speeds, may very well be quite different from the propagation path that is associated with another set of signals (not shown) on the bus 130 between one of the two devices 110, 120 and perhaps another device (not shown), which is one of the advantages of these point-to-point source synchronous protocols. That is, a particular set of data signals DATA1-DATAN and associated strobe signal DSTROBE only couple two devices 110, 120 together, thus precluding many of the problems inherent to shared bus systems. In particular, propagation delay, bus impedance, and electrical characteristics of the propagation path affect the time at which the data signals DATA1-DATAN are stable, or "valid" for reception by the receiving bus agent 120. It is for this reason that source synchronous bus protocols are gaining prevalence in the market of fielded devices. In a typical configuration, the data strobe DSTROBE that is associated with a corresponding set of data signals DATA1-DATAN is routed along the same propagation path as the set of data signals DATA1-DATAN, and thus the strobe DSTROBE exhibits the same propagation characteristics as the data signals DATA1-DATAN themselves. If the strobe DSTROBE is asserted during the period in which the data carried by the data signals DATA1-DATAN is valid, when the receiving bus agent 120 detects a valid transition of the strobe DSTROBE, it is relatively certain that the data signals DATA1-DATAN will be valid as well.

The above advantages notwithstanding, the present inventors have observed that there are other factors which can adversely affect the integrity of a source synchronous interface, namely, the manner in which the data strobe DSTROBE is routed within a receiving device 120 after it has entered the device 120 at point 13S. Note in the diagram that while the data signals DATA1-DATAN and the data strobe DSTROBE are routed from DEVICE A 110 to DEVICE B 120 along approximately equivalent transmission paths, once the data strobe DSTROBE enters DEVICE B 120 at point 13S, it must be routed within DEVICE B 120 to N different synchronous receivers 122. And while an individual synchronous receiver 122 is optimally placed on a die layout to be very near where its corresponding data bit DATA1-DATAN enters the part 120, the same cannot be said for the data strobe DSTROBE because it must be distributed to all receivers 122 within a corresponding data group DATA1-DATAN. Hence, the present inventors have observed that while perhaps one of the synchronous receivers 122 will be placed such that the transmission paths of its data bit DATA1-DATAN and the data strobe DSTROBE from DEVICE A 110 to the inputs of the receiver 122 will be approximately the same, the relative transmission paths of remaining data bits DATA1-DATAN will be different from that of the data strobe DSTROBE as seen from inputs of their respective receivers 122. This is because the physical path that DSTROBE must travel will be either longer or shorter than the physical paths of the remaining data bits DATA1-DATAN and will also include buffering of DSTROBE for distribution. Consequently, it is likely that switching of the data strobe DSTROBE will occur earlier or later during the period of data validity for those remaining data bits DATA1-DATAN than is intended by DEVICE A. In fact, an extreme case contemplated by this application is that routing of the data strobe DSTROBE within DEVICE B 120, which cannot necessarily be controlled by the designers of DEVICE A 110, would be such that the one or more of the transmission paths to its corresponding receiver 122 is configured so that when the data strobe DSTROBE changes state to indicate that the data group DATA1-DATAN is valid, it is entirely possible that one or more of the data bits DATA1-DATAN corresponding to those one or more transmission paths will not be valid at the moment DSTROBE changes state.

In addition, because the clocks DSCLK, DCLK associated with transmission of data DATA1-DATAN over the synchronous bus 130 are generated typically by analog circuits (e.g., phase locked loops) within the core clocks generator 111, it has also been noted by the present inventors that jitter, duty-cycle, and inaccuracies due to design or fabrication within the generator 111 itself would be such that switching of the data strobe DSTROBE to indicate validity of the data group DATA1-DATAN is not optimal for reception by all of the receivers 122 in DEVICE B 120, thus further exacerbating misalignment of the signals DSTROBE, DATA1-DATAN in the receiving device 120. The problems associated with non-optimal switching of the data strobe DSTROBE relative to one or more data bits DATA1-DATAN as seen by a receiver 122 will now be discussed more specifically with reference to FIG. 2.

Figure 2:
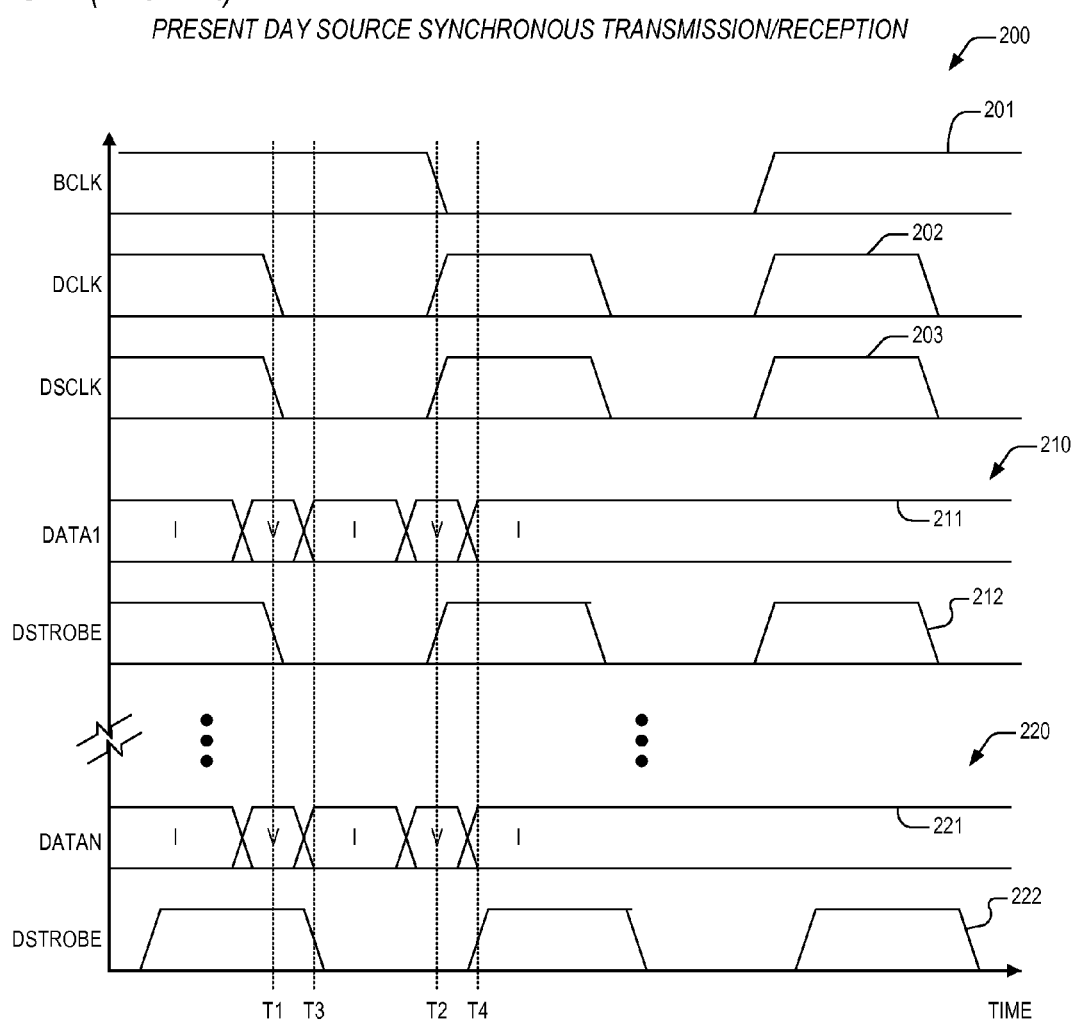
FIG. 2 is a timing diagram depicting two source synchronous signaling scenarios that may occur in the present day system of FIG. 1: one scenario in which a data strobe in a receiving device is in synchronization with associated data, and a second scenario in which the data strobe and the associated data are unsynchronized.

FIG. 2 is a timing diagram 200 depicting two source synchronous signaling scenarios 210, 220 that may occur in the present day system 100 of FIG. 1: one scenario 210 in which a data strobe 212 in a receiving device is in synchronization with associated data 211, and a second scenario in which the data strobe 222 and the associated data 221 are unsynchronized. The relative phases of the strobes 212, 222 and corresponding data 211, 221 may result from transmission path differences due to routing, buffering, distribution delays, or clock generator inaccuracies as discussed above, or they may be caused by other inaccuracies or errors within either a transmitting device or receiving device.

The diagram 200 depicts a bus clock signal BCLK 201, from which both a data clock signal DCLK 202 and a data strobe clock signal DSCLK 202 are derived. As noted with reference to FIG. 1, DCLK and DSCLK are distributed in the transmitting device to synchronous data drivers and data strobe drivers associated with a given data group DATA1-DATAN. These signals 202-203 are employed by the drivers to accurately place the data group DATA1-DATAN on a synchronous bus and also to indicate validity of the data DATA1-DATAN so that the receiving device can correctly receive the data DATA1-DATAN. It is noted that both DCLK 202 and DSCLK 203 appear to be twice the frequency of BCLK 201. This is presented specifically for clarity purposes in order to teach problems associate with the prior art as one skilled in the art will appreciate that such clock signals 202-203 in a present day device are skewed in phase according to their precise purpose and their relative frequencies range anywhere from 2 times the frequency of BCLK to 64 times the frequency of BCLK, but a presentation of the limitations of present day techniques is much more clearly illuminated when the frequencies are as shown in the diagram 200.

The diagram 200 also shows a scenario 210 where a data input 211 and data strobe input 212 at a first receiver for bit DATA1 are in synchronization and a scenario 220 where a data input 221 and a strobe input 222 at an nth receiver for bit DATAN are not in synchronization. The relative phases of the data strobe DSTROBE to all other data bits DATA2-DATA(N−1) (not shown) within the data group DATA1-DATAN may exhibit more or less favorable alignments than those shown in the diagram 200.

Accordingly, at time T1, transmission of the data bits DATA1-DATAN is roughly halfway through a period of validity (V) on the synchronous bus, as is indicated by the falling edge of DCLK. It is noted that assertion of the data DATA1-DATAN on the bus can occur during other edges or phases of DCLK. At such a time, DSCLK transitions as well, thus causing assertion of DSTROBE. According to scenario 210, DSTROBE is received at input 212 of the first receiver essentially halfway through the validity period for DATA1, which is received at input 211 of the first receiver. This is an optimum condition for reception of DATA1 and indicates that the transmission line effects, particularly propagation times, of DATA1 and DSTROBE, as seen by inputs 211 and 212 of the first receiver, are approximately equivalent. The same optimum reception condition is seen by the inputs 211-212 at time T2.

But such is not the case under scenario 220, where DSTROBE at input 222 is actually sensed switching states at times T3 and T4 during times when DATAN is seen at input 221 as being invalid. That is, for reasons alluded to earlier, at input 222 DSTROBE is seen to lag DATAN at input 221 in phase. This could be due to a long path that DSTROBE must travel from an input to the receiving device to reach a receiver for DATAN, or could be due to inaccuracies in a transmitting device, or could result from other reasons.

Accordingly, the present inventors have observed that once a device has completed design and fabrication, there exists no reasonable way to correct these types of problems short of adding propagation delay via motherboard routing to one or more of the data bits DATA1-DATAN or to the data strobe DSTROBE in order to compensate for problems in either the transmitting or receiving device.

In addition, the present inventors have noted that it is very desirable to provide a mechanism whereby that phase differences between data bits DATA1-DATAN and strobes DSTROBE over a source synchronous bus can be adjusted or otherwise modified without a requirement to modify the layout of traces on a motherboard and without a requirement to modify one or more of the receiving and transmitting devices.

The present invention overcomes the problems noted above with prior art source synchronous bus mechanisms by providing apparatus and methods for fine tuning the relative phase differences, as seen by individual receivers in a receiving device, between a data strobe and its corresponding data bits within a data group. The present invention will now be discussed with referenced to FIGS. 3-7.

Figure 3:
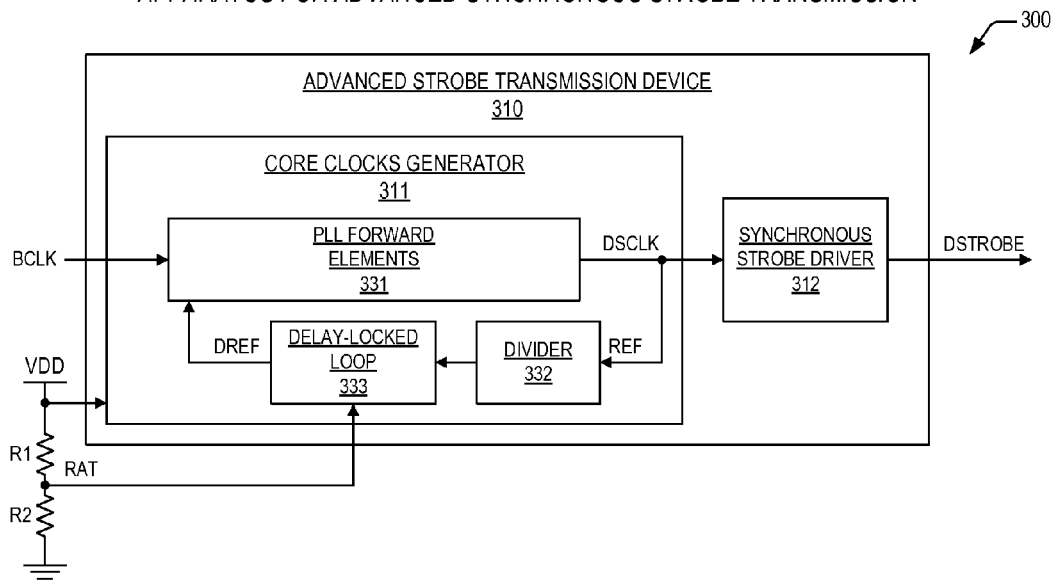
FIG. 3 is a block diagram featuring an apparatus for advanced synchronous strobe transmission according to the present invention.

Referring to FIG. 3, a block diagram is presented featuring an apparatus 300 for advanced synchronous strobe transmission according to the present invention. The apparatus 300 includes an advanced strobe transmission device 310 that is coupled to a bus clock BCLK and that generates a data strobe DSTROBE, substantially similar to DEVICE A 110 of FIG. 1 with the exception that the advanced strobe transmission device 310 according to the present invention may be configured via an input RAT to advance transmission of DSTROBE relative to transmission of its associated data bits (not shown). Input RAT is coupled to resistors R1 and R2. Resistor R1 is coupled to a reference voltage VDD, which is also coupled to the device 310. Resistor R2 is also coupled to a common ground reference.

The device 310 includes a core clocks generator 311 and a synchronous strobe driver 312. The output of the synchronous strobe driver 312 is DSTROBE. The core clocks generator 311 includes phase locked loop (PLL) forward elements 331, such as a well known in the art, which generate signal DSCLK. The generator 311 also includes a frequency divider 332, which receives a reference signal REF that is a feedback of DSCLK. The generator 311 further includes a delay-locked loop 333 that is coupled to the divider 332 and that receives signal RAT. The delay-locked loop 333 provides a delayed reference signal DREF, which is feed back to the PLL forward elements 331.

In operation, the core clocks generator 311 is configured to generate signal DSCLK at a frequency multiple of BCLK, where the multiple is determined by known means via configuration of the PLL forward elements 331 and the divider 332. In addition, the generator 331 is configured to advance the phase of DSCLK relative to BCLK by an amount specified by RAT. In one embodiment, RAT is configured to prescribe an advance of DSCLK up to one half cycle of DSCLK. In one embodiment, the ratio of R2 to R1 determines a voltage value for RAT, which is detected by the delay-locked loop 333 as a percentage of VDD, and the delay-locked loop 333 is configured to introduce delay proportional to the value of RAT into the output of the divider 332 to produced the delayed reference signal DREF, thus causing the forward elements 331 to advance DSCLK in phase by the same amount as the delay. In one embodiment, if the ratio is infinitely small (i.e., R2 equals 0 ohms), then no delay is introduced by the delay-locked loop 333, and the core clocks generator 311 functions substantially similar to the core clocks generator 111 of FIG. 1. If the ratio is infinitely large (i.e., R1 equals 0 ohms), then a delay approximately equal to one half cycle of DSCLK is introduced by the delay-locked loop 333, thus causing DSCLK to advance by approximately the same amount. If the ratio is equal to one (i.e., R1 is equal to R2), then a delay approximately equal to one quarter cycle of DSCLK is introduced by the delay-locked loop 333, thus causing DSCLK to advance by approximately the same amount. Other mechanisms are contemplated as well to include greater delays generated by the delay-locked loop 333, thus causing advance of DSCLK by amounts greater that one half cycle. Other embodiments consider non linear prescription of the amount of advance.

In an alternative embodiment, core clocks generator 311 may be configured such that the delay-locked loop 333 precedes the divider 332 in the feedback chain for DSCLK. That is, rather than delaying a feedback signal in frequency approximately equal to that of BCLK and then delaying that signal by an amount indicated by RAT, this embodiment would delay DSCLK by the amount indicated by RAT, and then the delayed DSCLK is frequency divided to produce DREF.

The advanced strobe transmission device 310 according to the present invention is configured to perform the functions and operations as discussed above. The device 310 comprises logic, circuits, devices, or microcode (i.e., micro instructions or native instructions), or a combination of logic, circuits, devices, or microcode, or equivalent elements that are employed to execute the functions and operations according to the present invention as noted. The elements employed to accomplish these operations and functions within the device 310 may be shared with other circuits, microcode, etc., that are employed to perform other functions and/or operations within the device 310. According to the scope of the present application, microcode is a term employed to refer to a plurality of micro instructions. A micro instruction (also referred to as a native instruction) is an instruction at the level that a unit executes. For example, micro instructions are directly executed by a reduced instruction set computer (RISC) microprocessor. For a complex instruction set computer (CISC) microprocessor such as an x86-compatible microprocessor, x86 instructions are translated into associated micro instructions, and the associated micro instructions are directly executed by a unit or units within the CISC microprocessor.

Accordingly, a device 310 according to the present invention is enabled to advance transmission of its data strobe DSTROBE relative to transmission of bits within its associated data group to compensate for phase misalignments of the signals as seen by a receiving device.

Figure 4:
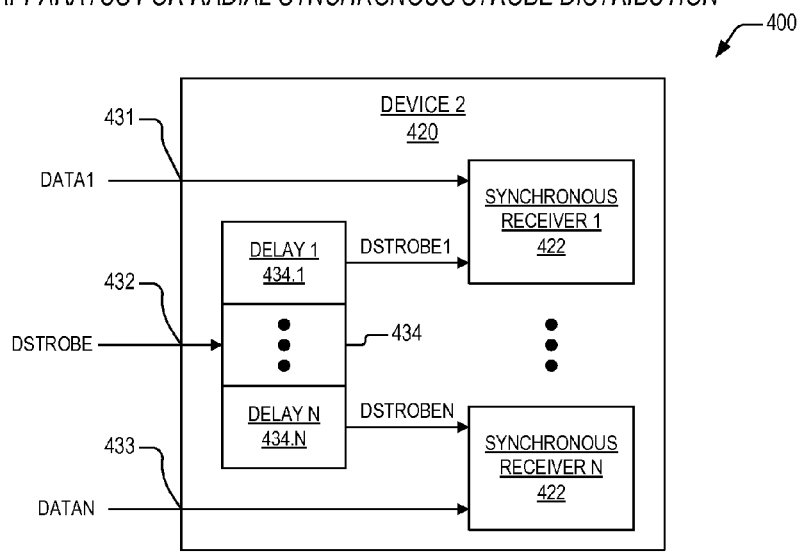
FIG. 4 is a block diagram showing a radial synchronous strobe distribution mechanism according to the present invention, such as might be employed in conjunction with the apparatus of FIG. 3.

Turning now to FIG. 4, a block diagram is presented showing a radial synchronous strobe distribution mechanism 400 according to the present invention, such as might be employed in conjunction with the apparatus 300 of FIG. 3. The mechanism 400 includes a receiving device DEVICE B 420, similar to the receiving device 120 of FIG. 1, the principal difference between the two being that the receiving device 420 according to the present invention includes a composite delay element 434 that equalizes all of the delay paths within the receiving device 420 for a data strobe signal DSTROBE that is received from a transmitting device (not shown) like the device 310 of FIG. 3. The receiving device 420 has a plurality synchronous receivers 422 configured to receive one or more data bit signals DATA1-DATAN along with DSTROBE. A first one of the plurality of data signals DATA1 enters the device 420 at a first point 431 and exhibits a first propagation delay from the first point 431 its associated synchronous receiver 422. A last one of the plurality of data signals DATAN enters the device 420 at a last point 433 and exhibits a last propagation delay from the last point 433 to its associated synchronous receiver 422. One or more of the plurality of data signals DATA1-DATAN exhibits a longest propagation delay relative to remaining ones of the plurality of data signals DATA1-DATAN.

The data strobe DSTROBE enters the device 420 at point 432 and is routed to the composite delay element 434. The composite delay element 434 includes a plurality of delay elements 434.1-434.N, each associated with a corresponding one of the plurality of synchronous receivers 422. Each of the plurality of delay elements 434.1-434.N is configured to introduce a time delay into the propagation path of DSTROBE as it is routed from the composite delay element 434 to a corresponding receiver 422. In one embodiment, the amount of delay for each of the plurality of delay elements 434.1-434.N is configured such that all propagation paths of DSTROBE from point 432 to inputs of each of the plurality of synchronous receivers 422 is equal to the longest propagation delay noted above. In one embodiment, each of the delay elements 434.1-434.N comprise one or more pairs of inverters. In an embodiment fabricated under a 32 nanometer process, each of the inverter pairs exhibits approximately 20 picoseconds of gate delay, thus introducing 20 picoseconds of delay into the associated propagation path for DSTROBE.

Accordingly, utilization of the mechanism 400 of FIG. 4 causes all of the receivers 422 in the receiving device 420 to experience an approximately equal lag in phase of the data strobe signal DSTROBE relative to each one of the plurality of data bit signals DATA1-DATAN. Consequently, it is advantageous to employ the advanced strobe transmission device 310 according to the present invention in this scenario where values of R1 and R2 are chosen such that the transmission phase of DSTROBE is advanced such that it is precisely halfway between the validity periods of each of the plurality of data signals DATA1-DATAN as seen by the plurality of synchronous receivers 422. For example, if the longest delay is, say, 10 picoseconds in a 32 nanometer process part, then each of the delay elements 434.1-434.N would be configured to introduce additional delay into their respective propagation path of DSTROBE to a corresponding synchronous receiver 422 such that the overall propagation delay from point 432 to the receiver input is 10 picoseconds, and the value of R1 and R2 would be selected to introduce an advance of 10 picoseconds into transmission of DSTROBE relative to transmission of the data bits DATA1-DATAN.

The device 420 according to the present invention is configured to perform the functions and operations as discussed above. The device 420 comprises logic, circuits, devices, or microcode, or a combination of logic, circuits, devices, or microcode, or equivalent elements that are employed to execute the functions and operations according to the present invention as noted. The elements employed to accomplish these operations and functions within the device 420 may be shared with other circuits, microcode, etc., that are employed to perform other functions and/or operations within the device 420.

Figure 5:
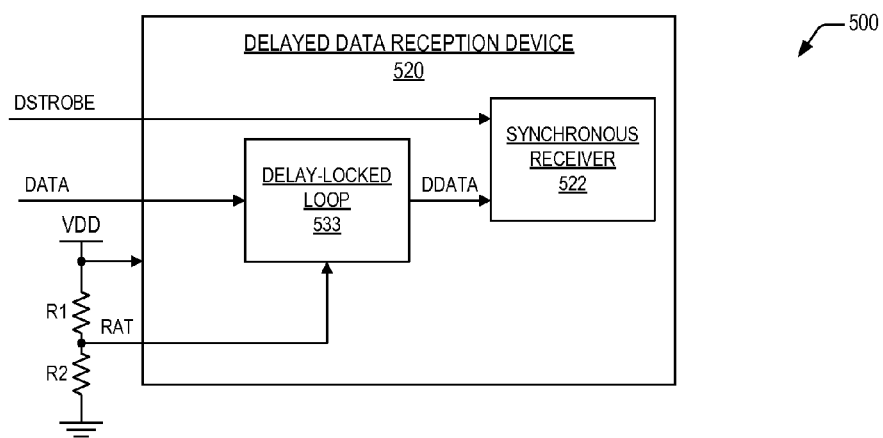
FIG. 5 is a block diagram illustrating an apparatus for delayed synchronous data reception according to the present invention.

Referring to FIG. 5, a block diagram is presented illustrating an apparatus 500 for delayed synchronous data reception according to the present invention. The apparatus 500 includes a delayed data reception device 520, similar to the receiving device 120 of FIG. 1, with the exception that the device 520 is capable of introducing delay into the propagation path of one or more data bits within a data group in order to align the validity period of the one or more data bits at a synchronous receiver 522 with a corresponding data strobe signal DSTROBE. This embodiment of the present invention, rather than advancing the phase of DSTROBE relative to a data bit DATA, delays the phase of the data bit DATA relative to that of DSTROBE.

Accordingly, the device 520 is coupled to a ratio signal RAT and to a voltage reference VDD. A first resistor R1 is coupled between VDD and RAT and a second resistor R2 is coupled between RAT and a ground reference. The device 520 includes a delay-locked loop 533 that receives the data bit DATA and that generates a delayed data signal DDATA having a delay proportional to the ratio of R2 to R1. DDATA is input along with DSTROBE to the synchronous receiver 522.

In operation, the delay-locked loop 533 is configured to delay the phase of DATA relative to DSTROBE by an amount specified by RAT. In one embodiment, RAT is configured to prescribe a delay of DATA up to one half cycle of DSTROBE. In one embodiment, the ratio of R2 to R1 determines a voltage value for RAT, which is detected by the delay-locked loop 533 as a percentage of VDD, and the delay-locked loop 533 is configured to introduce delay proportional to the value of RAT into its output signal DDATA, thus enabling the synchronous receiver 522 to experience a more favorable condition for reception of DATA. In one embodiment, if the ratio is infinitely small (i.e., R2 equals 0 ohms), then no delay is introduced by the delay-locked loop 533, and the receiver 522 experiences the same reception conditions as the receiver 122 of FIG. 1. If the ratio is infinitely large (i.e., R1 equals 0 ohms), then a delay approximately equal to one half cycle of DSTROBE is introduced by the delay-locked loop 533, thus causing DATA to be delayed by approximately the same amount. If the ratio is equal to one (i.e., R1 is equal to R2), then a delay approximately equal to one quarter cycle of DSTROBE is introduced by the delay-locked loop 533, thus causing DATA to be delayed by approximately the same amount. Other mechanisms are contemplated as well to include greater delays generated by the delay-locked loop 533, thus causing delay of DATA by amounts greater that one half cycle. Other embodiments consider non linear prescription of the amount of delay introduced by the delay-locked loop 533.

Although only one synchronous receiver 522 is shown for clarity sake, the present inventors note that one embodiment of the present invention contemplates a plurality of delay-locked loops 533 associated with a corresponding plurality of receivers 522 for associated bits within a data group, where the value or RAT is distributed to each of the plurality of delay-locked loops 533 such that an equal amount of delay is introduced into the propagation path of each of the plurality of bits within the data group.

The device 520 of FIG. 5 is well suited for delaying one or more data bits DATA within a data group, particularly when the device 520 incorporates a radial data strobe distribution mechanism like that discussed with reference to FIG. 4. In that the device 420 of FIG. 4 adds delay to the propagation paths associated with the data strobes DSTROBE1-DSTROBEN associated with a data group so that all of the propagation paths exhibit the phase lag corresponding to the slowest propagation path, there then may exist a requirement to delay one or more of the data bits DATA1-DATAN to realign them with the delayed strobes DSTROBE1-DSTROBEN. Accordingly, incorporating the delayed data reception mechanism of FIG. 5 into the device 420 of FIG. 4 will enable optimum alignment of these signals.

The device 520 according to the present invention is configured to perform the functions and operations as discussed above. The device 520 comprises logic, circuits, devices, or microcode, or a combination of logic, circuits, devices, or microcode, or equivalent elements that are employed to execute the functions and operations according to the present invention as noted. The elements employed to accomplish these operations and functions within the device 520 may be shared with other circuits, microcode, etc., that are employed to perform other functions and/or operations within the device 520.

Figure 6:
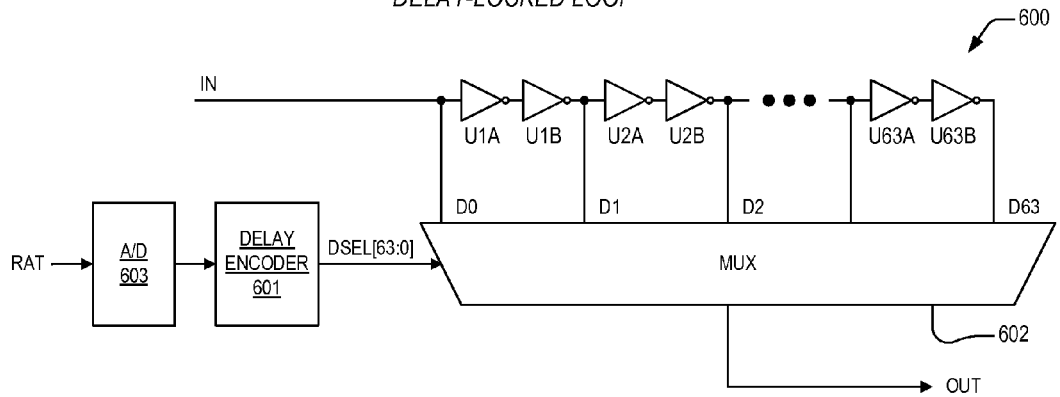
FIG. 6 is a block diagram detailing a delay-locked loop according to the present invention, such as might be employed in the apparatus of FIGS. 3 and 5.

Now referring to FIG. 6, a block diagram is presented detailing a delay-locked loop (DLL) 600 according to the present invention, such as might be employed in the apparatus of FIGS. 3 and 5. The DLL 600 includes an analog-to-digital (A/D) converter 603 that receives a ratio signal RAT where the value of RAT indicates an amount of delay to introduce into a propagation path of a signal IN. When used with the advance strobe transmission device 310 of FIG. 3, signal IN is the output of the divider 332 and signal OUT is DREF. When used with the delayed data reception device 520 of FIG. 5, signal IN is DATA and signal OUT is DDATA. The A/D converter 603 converts RAT to a digital signal that is provided to a delay encoder 601. The delay encoder 601 generates states of signals on a delay select bus DSEL[63:0], which is shown having 64 bits for clarity sake, although different numbers of bits are comprehended by the present invention. DSEL[63:0] are coupled as select inputs to a mux 602. Signal IN is routed through a plurality of inverter pairs U1A, U1B, . . . , U63A, U63B, each having equivalent gate delay. Delay taps D0-D63 are provided as inputs to the mux 602 and the mux 602 provides signal OUT based upon the value of the delay select bus DSEL[63:0], where only one of the bits in the delay select bus DSEL[63:0] is exclusively asserted in order to direct the mux 602 to select a designated delay tap D0-D63. For example, if all bits are not asserted, then the mux 602 selects tap D0, thus introducing no delay at all into signal IN. If bit 63 is asserted, then the mux 602 selects tap D63, thus introducing a maximum amount of delay into signal IN. The sizing (i.e., number of inverter pairs U1A, U1B, . . . , U63A, U63B, delay taps D0-D63, and bus DSEL[63:0]) of the DLL 600 is provided to teach the present invention, but it is noted that different sizings are contemplated. In addition, the number of inverters between taps D0-D63 may be increased in order to generate longer delays commensurate with design requirements.

The DLL 600 according to the present invention is configured to perform the functions and operations as discussed above. The DLL 600 comprises logic, circuits, devices, or microcode, or a combination of logic, circuits, devices, or microcode, or equivalent elements that are employed to execute the functions and operations according to the present invention as noted. The elements employed to accomplish these operations and functions within the DLL 600 may be shared with other circuits, microcode, etc., that are employed to perform other functions and/or operations within the DLL 600.

Figure 7:
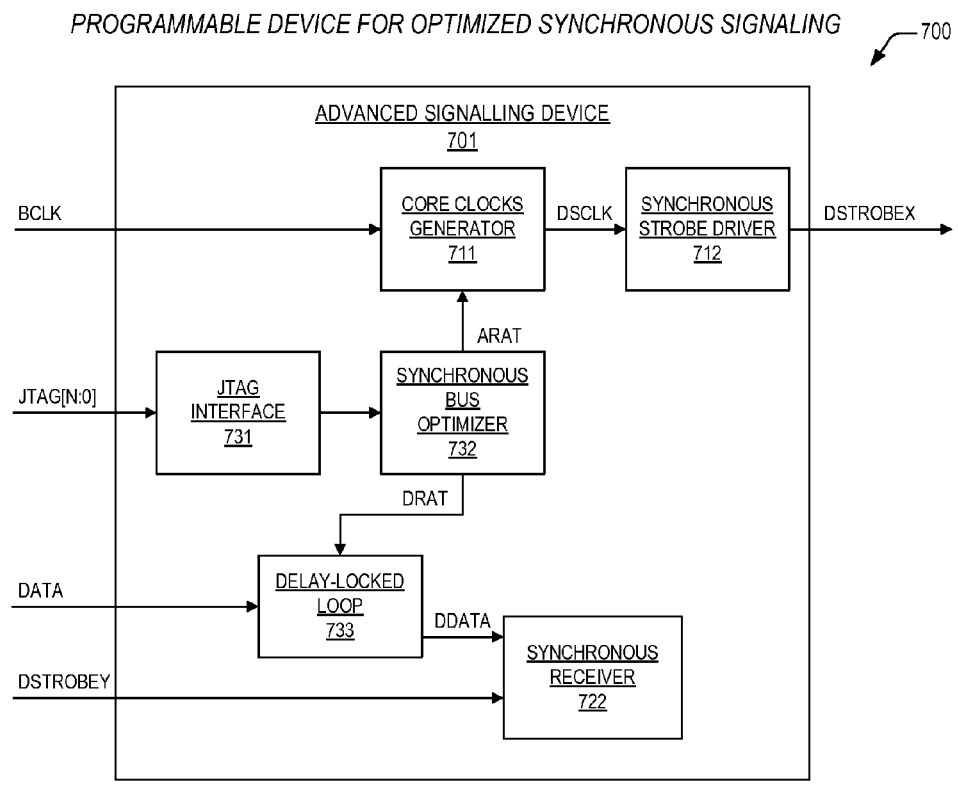
FIG. 7 is a block diagram showing a programmable device for optimized synchronous signaling according to the present invention.

Now turning to FIG. 7, a block diagram 700 is presented showing a programmable device 701 for optimized synchronous signaling according to the present invention. The device 701 includes a core clocks generator 711 that receives a bus clock signal BCLK. The generator 711 provides a data strobe clock signal DSCLK to a synchronous strobe driver 712. The synchronous strobe driver generates one of a plurality of data strobes DSTROBEX that are associated with data bits (not shown) corresponding to a particular address group as has heretofore been discussed.

The device 701 also includes a delay-locked loop (DLLs) 733 that receives a data bit DATA, and which provides a delayed data signal DDATA to a synchronous receiver 722. The receiver 722 also receives a different data strobe signal DSTROBEY that is associated with the data bit DATA.

In addition, the device 701 includes a Joint Test Action Group (JTAG) interface 731 that receives control information over a standard JTAG bus JTAG[N:0] and that provides information applicable for the advance of DSTROBEX and for the delay of DATA to a synchronous bus optimizer 732. The synchronous bus optimizer 732 provides programmable strobe advance information to the core clocks generator 711 via bus ARAT and provides programmable data bit delay information to the DLL 733 via bus DRAT.

In operation, well-known JTAG programming techniques are employed to program the precise amount of advance for one or more data strobes (only one strobe DSTROBEX is shown for clarity) and the precise amount of delay for one or more data bits DATA (only one bit DATA is shown for clarity). Such programming is performed when the device 701 is in a state where JTAG programming is allowed, such as a RESET state. Upon exit from the state, buses ARAT and DRAT function substantially similar to the RAT buses discussed with reference to FIGS. 3 and 5 to provide control information to the devices 310, 520. In addition, the device 701 may also incorporate radial distribution elements 434 like the device 420 of FIG. 4.

In one embodiment, bus ARAT is distributed to a plurality of core clocks generators 711, each developing a corresponding and unique advanced data strobe clock, where different amounts of advance are programmed via the JTAG interface 731 corresponding to that required for each of a plurality of data groups. Likewise, bus DRAT is distributed to a plurality of DLLs 733, each developing a corresponding and unique delayed data bit signal, where different amounts of delay are programmed over the JTAG interface 731 corresponding to that required for the plurality of data groups.

Consequently, the programmable device 701 of FIG. 7 enables a system designer to compensate for synchronous bus misalignment without a requirement to modify a system board.

The device 701 according to the present invention is configured to perform the functions and operations as discussed above. The device 701 comprises logic, circuits, devices, or microcode, or a combination of logic, circuits, devices, or microcode, or equivalent elements that are employed to execute the functions and operations according to the present invention as noted. The elements employed to accomplish these operations and functions within the device 701 may be shared with other circuits, microcode, etc., that are employed to perform other functions and/or operations within the device 701.

Those skilled in the art should appreciate that they can readily use the disclosed conception and specific embodiments as a basis for designing or modifying other structures for carrying out the same purposes of the present invention, and that various changes, substitutions and alterations can be made herein without departing from the scope of the invention as defined by the appended claims.

What is claimed is:

1. An apparatus that compensates for misalignment on a synchronous data bus, the apparatus comprising:
  a resistor network, configured to provide a ratio signal that indicates an amount to advance a synchronous data strobe associated with a data group;
  a transmitting device, comprising:
    a core clocks generator, coupled to said ratio signal, configured to advance a data strobe clock by said amount; and
    a synchronous strobe driver, configured to receive said data strobe clock, and configured to employ said data strobe clock to generate said synchronous data strobe, wherein said synchronous data strobe, when enabled, is advanced also by said amount; and
  a receiving device, comprising:
    a composite delay element, configured to equalize delay paths within said receiving device, wherein said delay paths correspond to said synchronous data strobe that is received from said transmitting device.

2. The apparatus as recited in claim 1, wherein said resistor network comprises two resistors, and wherein a ratio of said two resistors indicates said amount.

3. The apparatus as recited in claim 2, wherein a first one of said two resistors is coupled to a ground reference, a second one of said two resistors is coupled to a voltage reference, and said two resistors are coupled together at a node developing said ratio signal.

4. The apparatus as recited in claim 1, wherein said synchronous data strobe is advanced in phase by said amount, and wherein said amount ranges from no phase advance up to an advance of one half cycle of said data strobe clock.

5. The apparatus as recited in claim 1, wherein said transmitting device is coupled to a motherboard, and wherein said resistor network is coupled to said motherboard, and wherein said ratio signal enters said transmitting device through an external pin.

6. The apparatus as recited in claim 1, wherein said core clocks generator comprises:
  a phase locked loop (PLL), comprising:
    PLL forward elements, configured to receiver a bus clock signal, and configured to generate said data strobe clock signal at a frequency multiple of said bus clock signal;
    a frequency divider, configured to receive said data strobe clock signal, and configured to generate an output that is equal in frequency to said bus clock signal to enable said PLL forward elements to align said data strobe clock signal in phase with said bus clock signal; and
    a delay-locked loop (DLL), configured to receive said output and said ratio signal, and configured to delay said output by said amount.

7. The apparatus as recited in claim 1, wherein said core clocks generator comprises:
  a phase locked loop (PLL), comprising:
    PLL forward elements, configured to receiver a bus clock signal, and configured to generate said data strobe clock signal at a frequency multiple of said bus clock signal;
    a delay-locked loop (DLL), configured to receive said data strobe clock signal and said ratio signal, and configured to generate an output that comprises said data strobe clock signal delayed by said amount; and
    a frequency divider, configured to receive said output, and configured to generate a delayed reference signal that is equal in frequency to said bus clock signal to enable said PLL forward elements to align said output in phase with said bus clock signal, thereby causing said data strobe clock signal to be advanced by said amount.

8. An apparatus that compensates for misalignment on a synchronous data bus, the apparatus comprising:
  a resistor network, configured to provide a ratio signal that indicates an amount to advance a synchronous data strobe associated with a data group;
  a microprocessor, comprising:

a core clocks generator, coupled to said ratio signal, configured to advance a data strobe clock by said amount; and a synchronous strobe driver, configured to receive said data strobe clock, and configured to employ said data strobe clock to generate said synchronous data strobe, wherein said synchronous data strobe, when enabled, is advanced also by said amount; and a receiving device, comprising:

a composite delay element, configured to equalize delay paths within said receiving device, wherein said delay paths correspond to said synchronous data strobe that is received from said transmitting device.

9. The apparatus as recited in claim 8, wherein said resistor network comprises two resistors, and wherein a ratio of said two resistors indicates said amount.

10. The apparatus as recited in claim 9, wherein a first one of said two resistors is coupled to a ground reference, a second one of said two resistors is coupled to a voltage reference, and said two resistors are coupled together at a node developing said ratio signal.

11. The apparatus as recited in claim 8, wherein said synchronous data strobe is advanced in phase by said amount, and wherein said amount ranges from no phase advance up to an advance of one half cycle of said data strobe clock.

12. The apparatus as recited in claim 8, wherein said microprocessor is coupled to a motherboard, and wherein said resistor network is coupled to said motherboard, and wherein said ratio signal enters said microprocessor through an external pin.

13. The apparatus as recited in claim 8, wherein said core clocks generator comprises:

a phase locked loop (PLL), comprising:

PLL forward elements, configured to receiver a bus clock signal, and configured to generate said data strobe clock signal at a frequency multiple of said bus clock signal;

a frequency divider, configured to receive said data strobe clock signal, and configured to generate an output that is equal in frequency to said bus clock signal to enable said PLL forward elements to align said data strobe clock signal in phase with said bus clock signal; and a delay-locked loop (DLL), configured to receive said output and said ratio signal, and configured to delay said output by said amount.

14. The apparatus as recited in claim 8, wherein said core clocks generator comprises:

a phase locked loop (PLL), comprising:

PLL forward elements, configured to receiver a bus clock signal, and configured to generate said data strobe clock signal at a frequency multiple of said bus clock signal;

a delay-locked loop (DLL), configured to receive said data strobe clock signal and said ratio signal, and configured to generate an output that comprises said data strobe clock signal delayed by said amount; and a frequency divider, configured to receive said output, and configured to generate a delayed reference signal that is equal in frequency to said bus clock signal to enable said PLL forward elements to align said output in phase with said bus clock signal, thereby causing said data strobe clock signal to be advanced by said amount.

15. A method for compensating for misalignment on a synchronous data bus, the method comprising:

employing a resistor network to provide a ratio signal that indicates an amount to advance a synchronous data strobe associated with a data group;

within a transmitting device, coupling a core clocks generator to the ratio signal, and configuring the core clocks generator to advance a data strobe clock by the amount;

providing the data strobe clock signal to a synchronous strobe driver within the transmitting device, and using the data strobe clock to generate the synchronous data strobe, wherein the synchronous data strobe, when enabled, is advanced also by the amount; and via a composite delay element within a receiving device, equalizing delay paths within the receiving device, wherein the delay paths correspond to the synchronous data strobe that is received from the transmitting device.

16. The method as recited in claim 15, wherein the resistor network comprises two resistors, and wherein a ratio of the two resistors indicates the amount.

17. The method as recited in claim 16, wherein a first one of the two resistors is coupled to a ground reference, a second one of the two resistors is coupled to a voltage reference, and the two resistors are coupled together at a node developing the ratio signal.

18. The method as recited in claim 15, wherein the synchronous data strobe is advanced in phase by the amount, and wherein the amount ranges from no phase advance up to an advance of one half cycle of the data strobe clock.

19. The method as recited in claim 15, wherein the transmitting device is coupled to a motherboard, and wherein the resistor network is coupled to the motherboard, and wherein the ratio signal enters the transmitting device through an external pin.

20. The method as recited in claim 15, wherein the core clocks generator comprises:

a phase locked loop (PLL), comprising:

PLL forward elements, configured to receiver a bus clock signal, and configured to generate the data strobe clock signal at a frequency multiple of the bus clock signal;

a frequency divider, configured to receive the data strobe clock signal, and configured to generate an output that is equal in frequency to the bus clock signal to enable the PLL forward elements to align the data strobe clock signal in phase with the bus clock signal; and a delay-locked loop (DLL), configured to receive the output and the ratio signal, and configured to delay the output by the amount.

21. The method as recited in claim 15, wherein the core clocks generator comprises:

a phase locked loop (PLL), comprising:

PLL forward elements, configured to receiver a bus clock signal, and configured to generate the data strobe clock signal at a frequency multiple of the bus clock signal;

a delay-locked loop (DLL), configured to receive the data strobe clock signal and the ratio signal, and configured to generate an output that comprises the data strobe clock signal delayed by the amount; and a frequency divider, configured to receive the output, and configured to generate a delayed reference signal that is equal in frequency to the bus clock signal to enable the PLL forward elements to align the output in phase with the bus clock signal, thereby causing the data strobe clock signal to be advanced by the amount.

* * * * *